United States Patent [19]

Arai et al.

[11] Patent Number: 5,024,562
[45] Date of Patent: Jun. 18, 1991

[54] PRESSURE FOOT FOR PRINTED CIRCUIT BOARD DRILLING MACHINE

[75] Inventors: Kunio Arai, Atsugi; Yasuhiko Kanaya, Machida; both of Japan

[73] Assignee: Hitachi Seiko Ltd., Japan

[21] Appl. No.: 619,991

[22] Filed: Nov. 30, 1990

[51] Int. Cl.⁵ .............................................. B23B 47/00
[52] U.S. Cl. .................................... 408/1 R; 408/95; 408/56; 408/61; 408/67
[58] Field of Search .................. 408/1, 96–98, 408/95, 67, 58, 56, 51, 61; 409/137

[56] References Cited

U.S. PATENT DOCUMENTS

| | | | |
|---|---|---|---|
| 4,037,982 | 7/1977 | Clement | 408/67 X |
| 4,340,326 | 7/1982 | Buonauro et al. | 408/67 X |
| 4,813,825 | 3/1989 | Kosmowshi | 408/95 X |
| 4,822,219 | 4/1989 | Wood et al. | 409/137 |
| 4,915,550 | 4/1990 | Arai et al. | 408/67 X |
| 4,917,547 | 4/1990 | Frederichson et al. | 408/98 X |

FOREIGN PATENT DOCUMENTS 3734127  4/1989  Fed. Rep. of Germany ...... 409/137

OTHER PUBLICATIONS

Japanese Utility Model (unexamined) Publication No. 61-124313.

Primary Examiner—Larry I. Schwartz
Assistant Examiner—Robert Schultz
Attorney, Agent, or Firm—Evenson, Wands, Edwards, Lenahan & McKeown

[57] ABSTRACT

A pressure foot for a machine for drilling a printed circuit board is supported to be slidable in an axial direction of a rotor shaft and is connected to a vacuum suction source. The pressure foot is adapted to depress the printed circuit board during a drilling operation. A first air pathway is formed from a first supply port formed in a side wall of the pressure foot to a plurality of first blow-out ports formed in a contact surface of the pressure foot with the printed circuit board. The first supply port is connected with a pressure air source. A second air pathway extends from a second supply port formed in the side wall to a plurality of second blow-out ports opened toward an interior of the pressure foot. The second air pathway is in communication with a supply source of a pressure air. Thus, the working time and cost are reduced.

15 Claims, 8 Drawing Sheets

PRESSURE FOOT FOR PRINTED CIRCUIT BOARD DRILLING MACHINE

BACKGROUND OF THE INVENTION

The present invention relates to a printed circuit board drilling machine, and more particularly to a pressure foot for a printed circuit board drilling machine using a drill bit.

Japanese Utility Model Unexamined Publication No. 61-124313 shows a pressure foot for a printed circuit board drilling machine for effecting a drilling for a printed circuit board.

FIG. 9 in the present application shows an example of a printed circuit board drilling machine which comprises a bed 1 and a table 2 slidably supported on the bed 1 and driven by a drive apparatus (not shown). Drills 3 are prepared in holders fixed to the table 2. A column 5 is provided on the bed 1 so as to straddle the table 2. A spindle carriage 6 is slidably supported on the column 5 and is driven by an action of a Y-axis drive motor 7. A spindle saddle 8 is slidably supported on the spindle carriage 6 and is driven by an action of a Z-axis drive motor 9. Each rotor shaft 10 is supported on the spindle saddle 8 and is drivingly rotated by an action of a motor 11. A pressure foot 12 is mounted on a cylinder block 13. Reference character W designates a printed circuit board (hereinafter simply referred to as a board). The board W is fixed on the table 2 by standard pins P.

In such an arrangement, the table 2 and the spindle carriage 6 are moved relative to each other in X-Y directions to thereby locate the boards W and the rotor shafts 10. Thereafter, the spindles are moved in the Z-direction and the drilling is effected by the drills held at the associated rotor shafts 10.

FIG. 10 shows a structure of the spindle portion of the printed board drilling machine in which the cylinder block 13 is fixed on the spindle saddle 8. A large diameter hole 14 and a flange 15 radially inwardly projecting from one end of the hole 14 are formed on the cylinder 13. The hole 14 is in fluid communication with a pressurized air source through a pipe 16.

A spindle 17 is fitted in the cylinder block 13 and is adapted to rotatably support the rotor shafts 10. The motor 11 is supported at one end of the spindle 17 and is coupled with the rotor shaft 10. A chuck 18 is fixed to a lower end of the rotor shafts 10 and in turn holds the drill 3. A piston or ram 19 has a flange 21 for slidable moveable in a space defined by the hole 14 of the cylinder block 13 and the spindle 17.

The pressure foot 12 is fixed to one end of the piston 19. Formed on a side wall of the pressure foot 12 is a suction port 22 connected to a vacuum suction source (not shown). In a bottom wall of the pressure foot 12, there are formed grooves 23 for sucking air during the drilling.

With such a structure, the compressed air held at a predetermined pressure is supplied from the pipe 16 to thereby move the piston 19 toward the lower end of the cylinder block 13. The discharge of the air from the pressure foot 12 is effected through the suction port 22. At this time, the air is sucked from an opening portion formed at the lower end of the pressure foot 12 and is discharged through the suction port 22 as shown in FIG. 11.

Under this condition, when the spindle saddle 8 shown in FIG. 9 is lowered, the pressure foot 12 once holds the board W as shown in FIG. 12. Thereafter, the drill 3 is depressed into the board W to thereby perform the drilling operation.

In this case, the air is sucked into the pressure foot 12 through the grooves 23 and thereafter is discharged through the suction port 22. The flow of air sucked through the opening portion and the grooves 23 of the pressure foot 12 makes it possible to discharge cut chips and to cool the drill 3.

In general, a dust collector is used for collecting cut chips as the vacuum suction source, and a pressure within the pressure foot 12 during the drilling is about 200 mmHg.

In a conventional machine, the drilling is effected while the printed circuit boards W are held by the pressure foot 12, whereby it is possible to prevent the vibration and lift of the printed circuit boards W during the drilling to thereby perform a high quality drilling and at the same time to prevent damage to the drill 3.

On the other hand, the cut chips or powders generated during the drilling are to be collected in the dust collecting device.

However, since the grooves 23 of the pressure foot 12 are small in size, it would be impossible to insure a sufficient amount of air flow during the drilling and also impossible to sufficiently cool the drill 3 and to remove the cut chips or powders.

In particular, in the case of the drill having a small diameter of 1 mm or less, it is likely that the cut chips clog the grooves of the drill and the discharge of the cut chips will be insufficient. For this reason, in the case where a deep-drilling with a larger ratio of the bore diameter to the depth thereof is desired, a thrust load and a radial load imposed on the drill 3 during the drilling are increased, so that breakage by bending or torsion is likely to occur.

In addition, if the grooves for the drill 3 are clogged by the cut chips, not only the cooling effect of the drill 3 will be worse but also the heat amount generated by the friction between the chips and the inner wall of the bore will be increased, so that the temperature of the drill 3 would be considerably elevated. Furthermore, since air kept at room temperature is simply blown to the drill 3, the temperature of the drill 3 would be not sufficiently reduced. Thus not only the wear of the drill 3 is markedly increased but also various problems such as an increase of the surface roughness of the inner wall of the hole drilled, a generation of burr at the inlet/outlet of the hole and an increased amount of smear.

Furthermore, a part of the cut chips generated during the drilling is left at a circumferential edge portion of the hole as a burr, or otherwise is adhered once to the inner wall of the pressure foot and the drill, and thereafter can fall on the printed circuit board.

If, under the condition that the chips left on the printed circuit board enters into a space between the pressure foot and the circuit board, the drilling is adversely effected with the printed circuit board being held. Hence the quality of the inner wall of the hole drilled is degraded due to the lift or vibration of the board, and at the same time, it is likely that the drill will be damaged.

Accordingly, in order to overcome these defects inherent in the conventional machine, an object of the invention is to provide a pressure foot for a printed circuit board drilling machine in which a drilling stroke is reduced to thereby reduce a drilling time, the drill is sufficiently cooled and the removal of the chips may be effected without fail.

SUMMARY OF THE INVENTION

According to the present invention, there is provided a pressure foot for a machine for drilling a printed circuit board. The pressure foot, which is supported to be slidable in an axial direction of a spindle, connected to a vacuum suction source and is adapted to hold the printed circuit board during a drilling operation. A first air pathway is formed from a first supply port formed in a side wall of the pressure foot to a plurality of first blow-out ports formed in a contact surface of the pressure foot with the printed circuit board. The first supply port is connected with a pressure air source, and a second air pathway extends from a second supply port formed in the side wall to a plurality of second blow-out ports opened toward an interior of the pressure foot. The second air pathway is in communication with a supply source of a pressure air.

According to one aspect of the invention, the first air pathway extending to the first blow-out ports formed in the contact surface of the pressure foot with the printed circuit board and the second air pathway extending to the plurality of second blow-out ports opened toward the interior of the pressure foot are formed in a pad fixed to a lower surface of the pressure foot.

In addition, the second blow-out ports are directed in a tangential direction with an outer circumference of a drill held by the spindle.

Furthermore, a nozzle having an orifice is formed in the second air pathway.

Then, pressurized air from the supply source is supplied to the first and second supply ports formed in the pressure foot side wall, and the pressure foot is moved toward the printed circuit boards. As a result, pressurized air is ejected from the first blow-out ports formed in the contact surface of the pressure foot with a contact plate laid on an uppermost layer of the printed circuit boards, so that a thin air film is formed between the bottom surface of the pressure foot and the contact plate. The thin air film formed between the bottom surface of the pressure foot and the contact plate serves as an air bearing mechanism. The bottom surface of the pressure foot depresses the contact plate through the thin air film so that the printed circuit boards are pressingly fixed by the contact plate and the bottom surface of the pressure foot.

Under the condition that the pressure air is supplied to the second supply port formed in the side wall of the pressure foot from the pressure air supply source, the drilling operation is effected for the printed circuit boards. As a result, the chips adhered to the drill are blown out by the pressure of the pressurized air ejected from the second blow-out ports opened toward the interior of the pressure foot through the second supply port. The blown chips are discharged together with the pressurized air ejected through the second blow-out ports since the air sucked through the grooves is discharged from the suction port during the drilling operation to thereby perform the discharge from the interior of the pressure foot.

Under the condition that the pressurized air from the pressure air supply source is supplied to the first supply port formed in the side wall of the pressure foot, the pressure foot is moved toward the printed circuit boards. Then, the bottom surface of the pressure foot depresses the contact surface downwardly through the air film. When the printed circuit boards are pressingly fixed in place by the contact plate and the bottom surface of the pressure foot, the air within the pressure foot is sucked through the suction port. As a result, the interior of the pressure foot is kept at a vacuum pressure. The pressure air which has passed through the second gas passage connected to the pressure air source and which is blown into the interior of the pressure foot from the plurality of second blow-out ports opened toward the lower inner portion of the pressure foot is abruptly expanded (i.e., an adiabatic expansion) to thereby have a low temperature within the second passage. The low temperature air is blown toward the drill along with the drill grooves to thereby enhance the efficiency of the chip removal and the drill cooling.

Accordingly, it is possible to depress the printed circuit board without fail, to improve the quality of the worked hole, and to prevent the damage of the drill.

DESCRIPTION OF THE PREFERRED EMBODIMENTS

Figure 1:
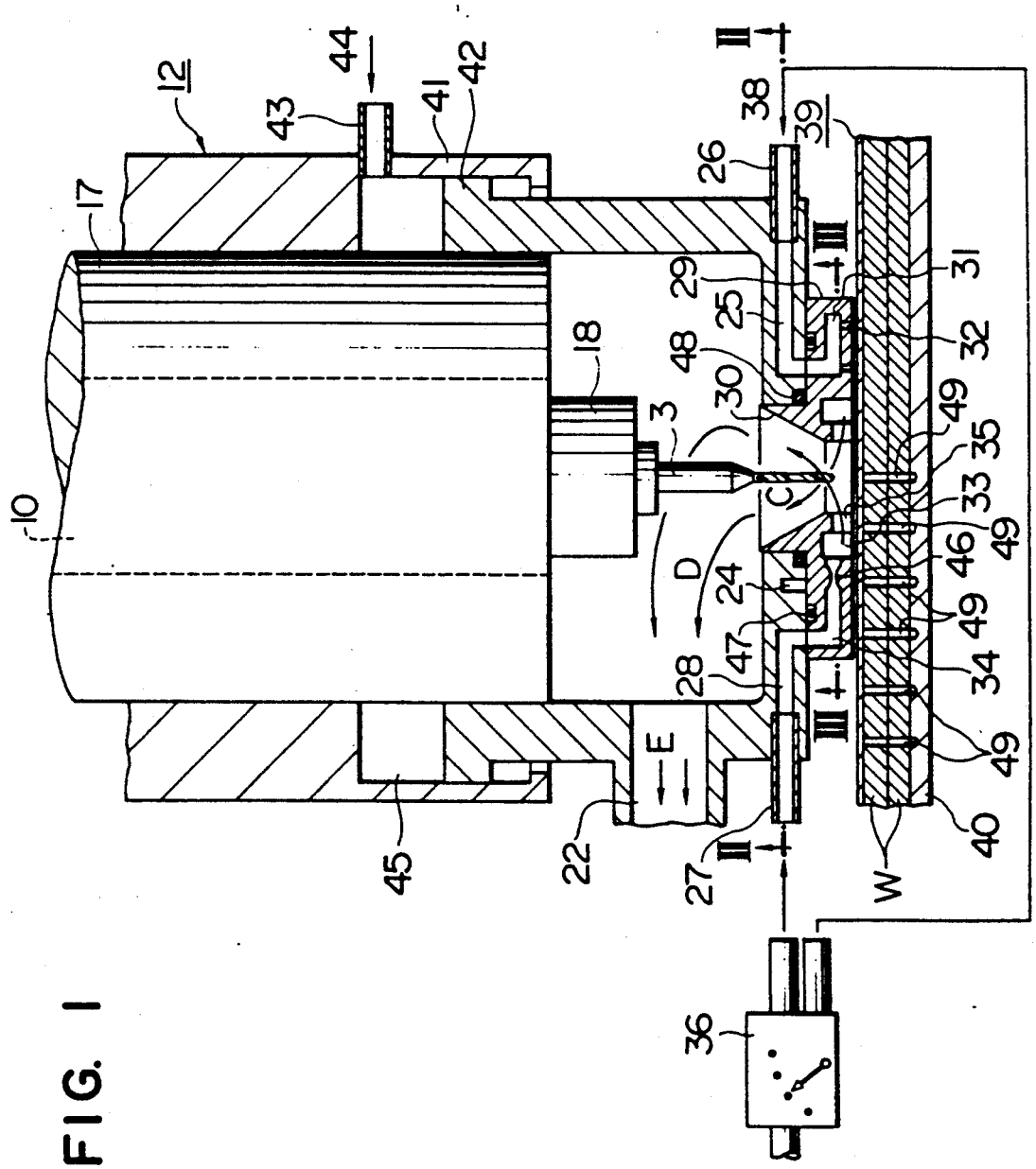
FIG. 1 is a side cross-sectional view showing a pressure foot for a printed circuit board drilling machine in accordance with one embodiment of the present invention.

In FIG. 1, a spindle 17 is adapted to rotatably support a rotor shaft 10 therein. A chuck 18 is fixed to the rotor shaft 10 for supporting a drill 3.

Figure 2:
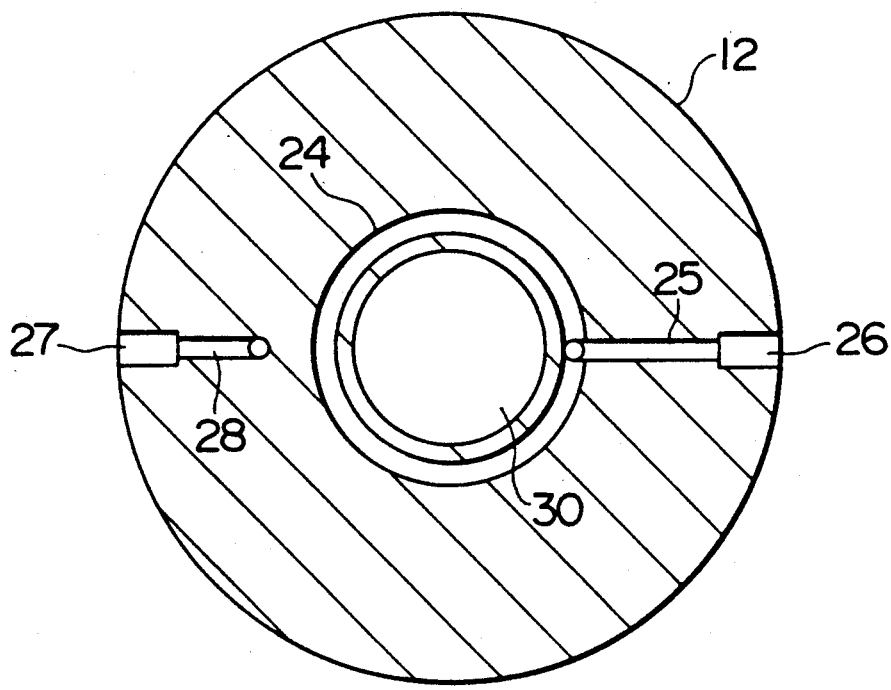
FIG. 2 is a cross-sectional view taken along the line II—II of FIG. 1.

A pressure foot 12 is slidably fitted with the spindle 17. A suction port 22 for discharging air and chips within the pressure foot 12 is formed on a side wall of the pressure foot 12 and is connected through a hose or the like to a dust collecting means (not shown). As shown in FIG. 2, an annular passage 24 is formed in a central portion of a lower end of the pressure foot 12 and is connected with a first air or gas passage 25 extending radially outwardly toward an outer wall of the pressure foot 12. A first supply port 26 is connected to the first gas passage 25. A second supply port 27 extending from the side wall of the pressure foot 12 is formed at the lower end of the pressure foot 12 as best shown in FIG. 2. A second air passage 28 extends radially inwardly toward the center from the second supply port 27. As shown in FIG. 1, the second air passage 28 is formed in an L-shape bending toward a lower end face of the pressure foot 12 and is opened at the lower end face of the pressure foot 12.

Figure 3:
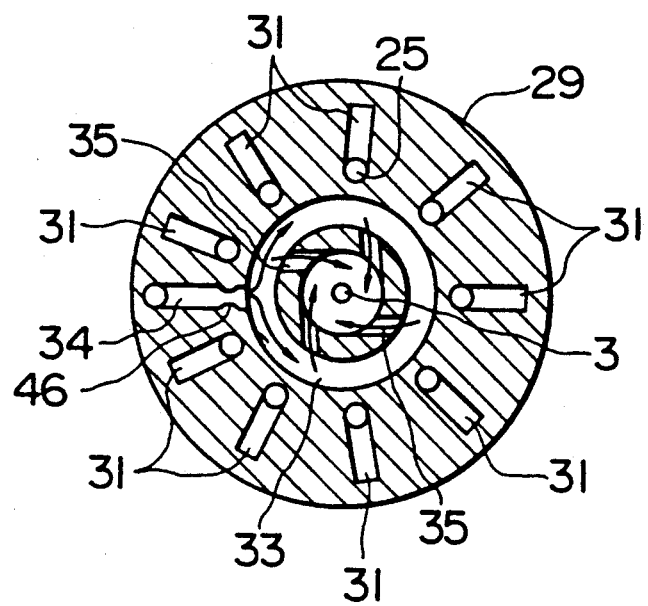
FIG. 3 is a cross-sectional view taken along the line III—III of FIG. 1.
Figure 4:
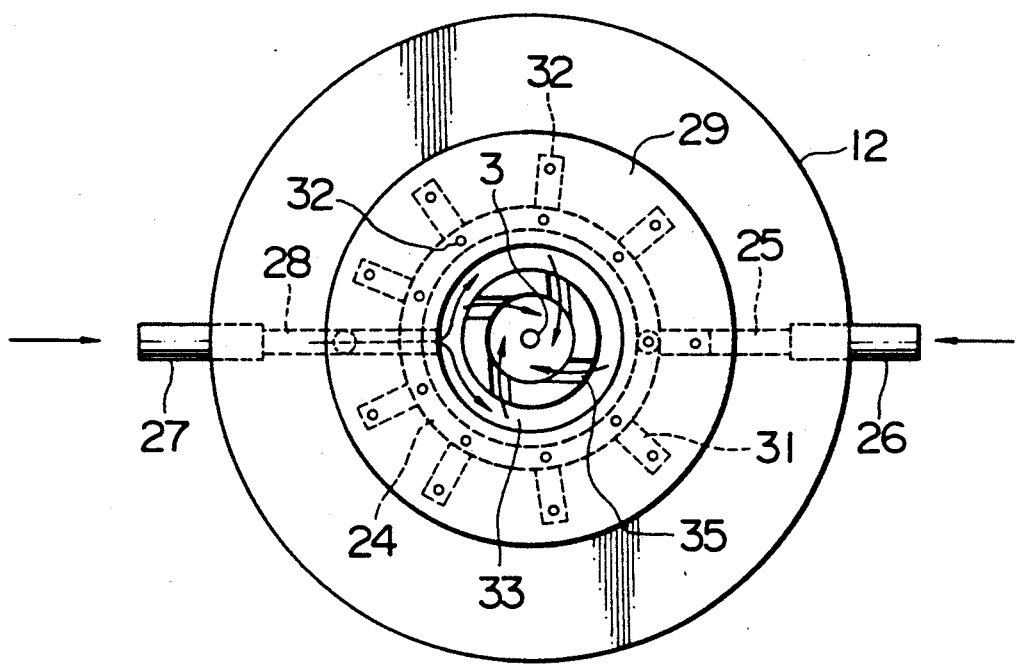
FIG. 4 is a bottom view showing an operation of the pressure foot shown in FIG. 1.

As best shown in FIG. 4, a pad 29 coupled at an engagement portion 30 to the pressure foot 12 is fixed to the lower end surface of the pressure foot 12. Formed in the pad 29 are a plurality of communication passages 31 connected to the first air passage 25 and extending radially with a predetermined length, as shown in FIG. 3. First blow-out ports 32 are formed in each of the plurality of communication passages 31 and are opened at a lower surface of the illustrated pad 29 (in the embodiment, two rows of first blow-out parts are formed). As shown in FIG. 3, an annular passage 33 is formed in the central portion of the pad 29. A passage 34 having a predetermined length toward the outer wall of the pad 29 is connected to the annular passage 33. An orifice-like nozzle 46 is formed within the passage 34.

A first air pathway is composed of the annular passage 24, the first air passage 25 and the communication passage 31. Also, a second air pathway is composed of the second air passage 28, the annular passage 33 and the passage 34.

Figure 5:
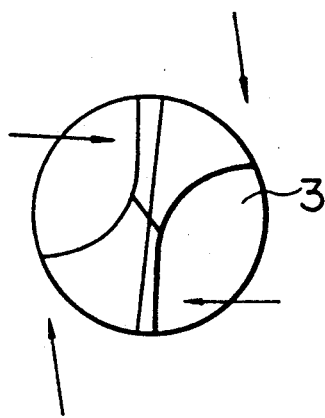
FIG. 5 is an enlarged bottom view of a drill for illustrating a relationship between the drill shown in FIG. 1 and air flow.

Second blow-out ports 35 are formed to open toward the inner portion of the lower end of the pressure foot 12. The second blow-out ports 35 are cut so as to blow the air to the drill 3 in conformity with the drill grooves as viewed from the drill tip as shown in FIG. 5.

A flow rate adjustable high pressurized air supply means 36 is used for supplying pressurized air to the first supply port 26 and the second supply port 27 by adjusting the pressures of the pressurized air individually for the two supply ports 26 and 27. Upon holding the printed circuit board 37 during the drilling, when the pressurized air 38 is supplied to the first supply port 26, the first air passage 25, the annular passage 24 and the communication passages 31 are pressurized so that the pressurized air 38 is ejected from the first blow-out ports 32. As a result, a thin air film is formed between the foot 12 and a contact plate 39 laid on the uppermost printed circuit board 37. The thin air film serves as an air bearing, and a depression force of the pressure foot 12 is applied to the contact plate 39 through the air film to thereby pressingly hold the printed circuit boards 37. Numeral 40 denotes a lower plate below the printed circuit boards.

Numeral 41 denotes a cylinder block of the spindle saddle (see FIG. 1), numeral 42 denotes a piston or ram of the pressure foot 12, and numeral 43 denotes a supply pipe for cylinder air. When the air 44 is supplied in the cylinder block 41, the pressure is increased in a cavity 45 to thereby move the pressure foot 12 in the Z-direction (see FIG. 1).

For removing the cut powders or chips and cooling the drill during the drilling, a predetermined amount of the pressurized air is adjusted in the flow rate adjustable high pressure air supply 36, and the pressurized air is supplied to the second supply port 27 and is led to the nozzle 46 through the second air passage 28 and the passage 34. The air is then adiabatically expanded by the nozzle 46 and its temperature is lowered through the passage 33. The air is further blown out against approximately tangential drill 3 in the directions in conformity with the drill grooves of the drill tip through the second blow-out ports 35, as shown in FIG. 5, to thereby cool the drill 3 and remove the cut chips. The air within the pressure foot 12 is kept at a vacuum level by the discharge port 22. As a result, the cut chips which have been removed from the tip of the drill 3 are led into the pressure foot 12 by the pressurized air blown from the second blow-out ports 35 and are discharged from the suction port 22 together with the pressurized air introduced into the pressure foot 12 and blown out from the second blow-out ports 35. Reference numerals 47 and 48 denote O-rings for preventing air leakage. Reference numeral 49 denotes bores formed in the boards.

With such an arrangement, when the pressurized air is blown from the second blow-out ports 35 in the directions indicated by the arrow C in FIG. 1, air flows indicated by the arrows C, D and E are generated as shown in FIG. 1 to thereby effect the discharge of the air from the suction port 22.

Accordingly, when the spindle saddle 8 is lowered, the lower end face of the pressure foot 12 (i.e., the lower surface of the pad 29) is first brought into contact with the contact plate 39 laid on the uppermost printed circuit board 37 to thereby depress the printed circuit board 37 through the contact plate 39. Then, the interior of the pressure foot 12 is shut off from the ambient air by contact between the pressure foot 12 and the contact plate 39 and is kept at a vacuum pressure. As a result, the pressurized air supplied from the second supply port 27 is led to the nozzle 46 through the second air passage 28 and the passage 34 and is adiabatically expanded through the nozzle 46. The temperature of the air is reduced at the passage 33 and is further blown against the drill tip of the drill 3 in the directions along the drill grooves as shown in FIG. 5 so that the air is abruptly expanded within the second blow-out ports 35 and the pressure foot 12. At this time, at the lower end face of the pressure foot 12 (i.e., the lower surface of the pad 29), the pressurized air 38 supplied from the first supply port 26 is kept at high pressure and is ejected through the blow-out ports 32, so that the thin air film is formed between the lower end face of the pressure foot 12 and the contact plate 39.

Furthermore, the spindle 17 is lowered, as shown in FIG. 1, and the drill 3 is depressed into the circuit boards W to form holes. In this case, the air blown out from the second blow-out ports 35 is caused to flow as indicated by the arrows C, D and E in FIG. 1, thus entraining the chips discharged from the boards W and cooling down the drill 3.

Likewise, when the spindle 17 is raised, the drill 3 is pulled out from the printed circuit boards W and the contact plate 39. In this case, since the air is caused to flow in the directions indicated by the arrows C, D and E in FIG. 1, the cut chips clogged in or adhered to the grooves of the drill 3 are removed by the air flowing in the directions C, D and E. At the same time, since the air whose temperature has been reduced is brought into contact with the drill 3, the drill 3 is effectively cooled down.

When the drilling is effected for the printed circuit boards 37 with the drill 3, the thin air film is formed between the lower end face of the pressure foot 12 (i.e., the lower surface of the pad 29) and the contact plate 39 as described above. A part of the high pressure air 38 ejected from the first blow-out ports 32 is discharged from the suction port 22 along the flow of the air indicated by the arrows D and E in FIG. 1 together with the pressure air blown toward the tip of the drill 3 as indicated by the arrow C in FIG. 1. Accordingly, the amount of the pressure air blown toward the tip of the drill 3 is larger than that ejected from the second blow-out ports 35 to thereby enhance the cooling efficiency of the drill 3.

When the drill 3 is pulled out from the boards W and the contact plate 39 to complete the single drilling, the thin air film is still formed between the lower end face and the contact plate 39. Therefore, the lower surface of the pressure foot 12, namely, the lower surface of the pad 29 is out of contact with the contact plate 39. Accordingly, it is possible to shift the drill 3 to another position for performing the next drilling on the printed circuit boards W without raising the pad 29 (which raising operation was needed in the prior art). Accordingly, it is unnecessary to provide a long stroke for the spindle 17 as in the prior art. It is possible to enhance the working efficiency.

As described above, in the present invention, the amount of the pressure air to be blown against the tip of the drill 3 is increased due to the thin film and the air is sucked from the suction part 22. Therefore, the flow rate of the air at the lower end opening portion of the pressure foot 12 is increased, so that the cooling effect of the drill 3 and the removal of the chips are enhanced.

The, blow of the pressure air may be directed toward the rotary center of the drill 3.

Figure 6:
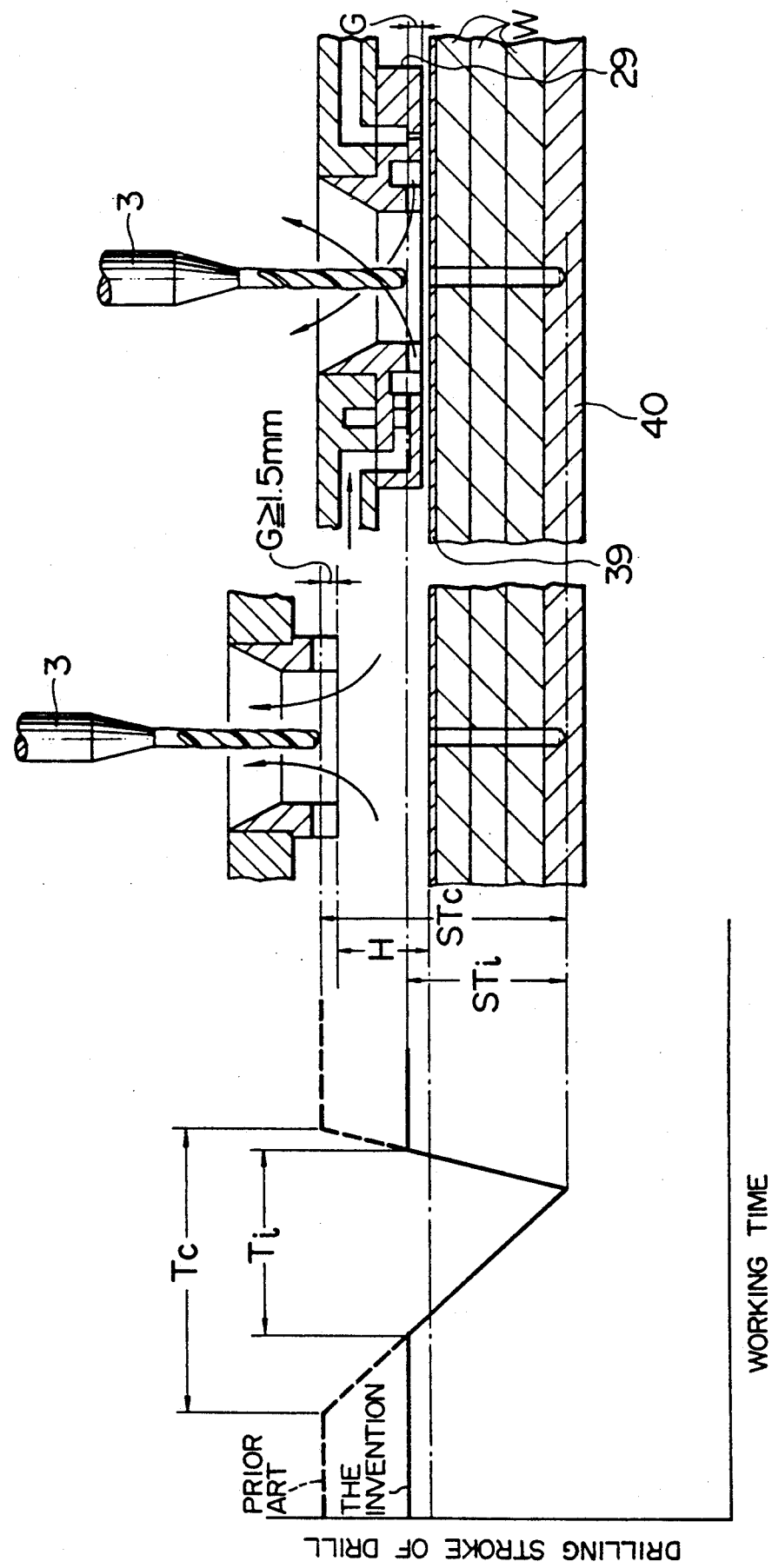
FIG. 6 is a view showing a relationship between the drilling stroke and the working time in comparison between the conventional pressure foot and the pressure foot shown in FIG. 1.

With reference to FIG. 6, the working efficiency of the invention will be described hereinafter. Taking the removability of the cut chips and the cooling efficiency of the drill into the consideration, it is necessary for the distance G between the drill end and the lower surface of the pad 29 to be more than 1.5 mm. Further, in order to move the pad 29 without dragging the contact plate 39, it is necessary for the distance H between the lower surface of the pad 29 and the contact plate 39 to be more than 3.0 mm. Accordingly, in a typical drilling in which three printed circuit boards W are stacked, the conventional drilling stroke STc of the drill 3 has been set at 10 mm. Meanwhile, in the present invention, the raising of the pad 29 upon the shifting of the drill to another position is not needed as described above. Accordingly, the drilling stroke STi of the drill can be set within a range of 6.7 mm to 7.0 mm and the working time period per one drilling can be reduced from Tc to Ti. Thus, the invention can enhance the working speed about 30% more than the prior art.

Figure 7:
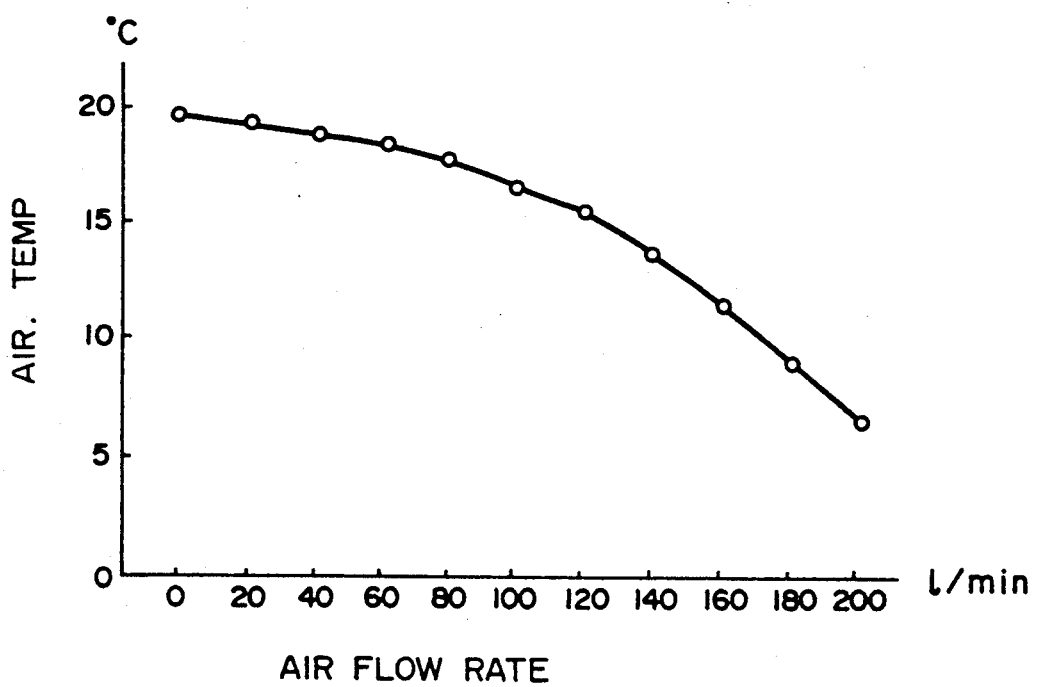
FIG. 7 is a graph showing a relationship between the cooling air temperature and the air flow rate.

Also, the temperature of the air discharged from a suction port 22 is lower as the larger amount of the air is supplied to the drill 3. Namely, as shown in FIG. 7, in the case where the air pressure is 6.0 kg/cm$^2$G and the nozzle diameter is about 1.5 mm, the temperature of the air discharged from the suction port 22 is decreased from the room temperature 20° C. to a temperature 7° C. at the flow rate of 200 l/mm. Accordingly, in accordance with the foregoing embodiment, since the amount of air supplied to the drill 3 is larger than that of the conventional machine, it is possible to enhance the cooling effect of the drill 3.

Figure 8:
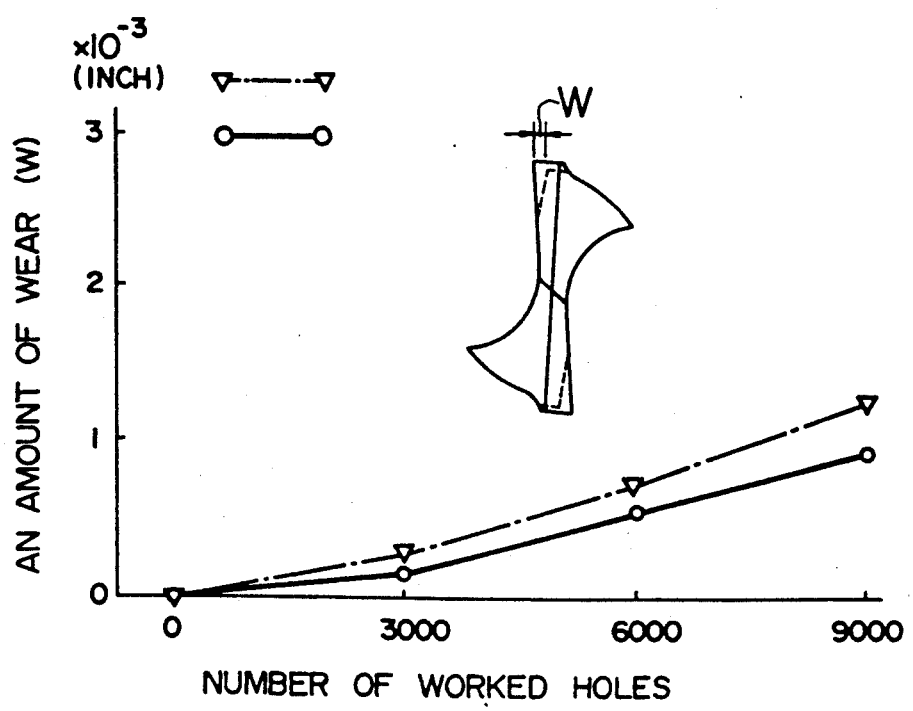
FIG. 8 is a graph showing a relationship between the drill wear and the number of the worked holes.
Figure 9:
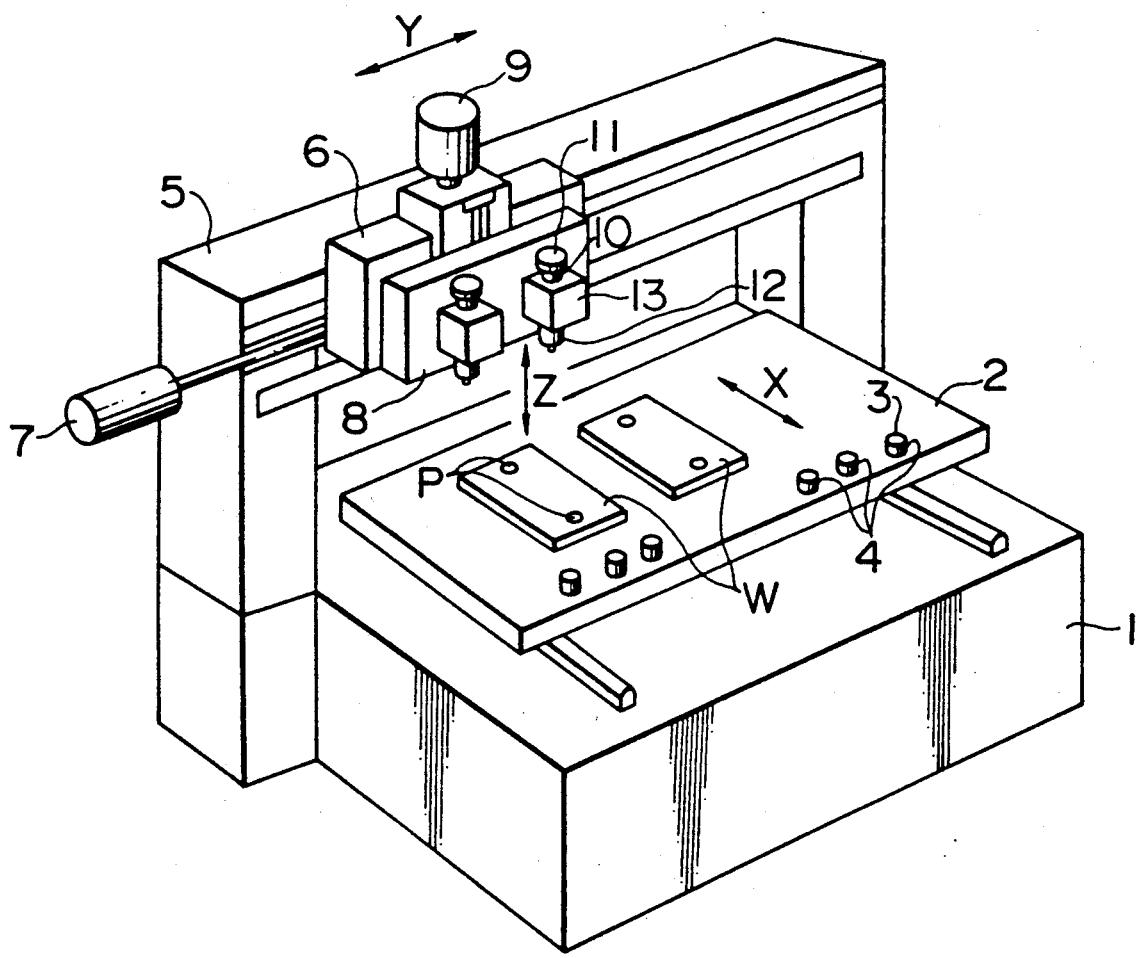
FIG. 9 is a perspective view showing a conventional printed circuit board drilling machine.
Figure 10:
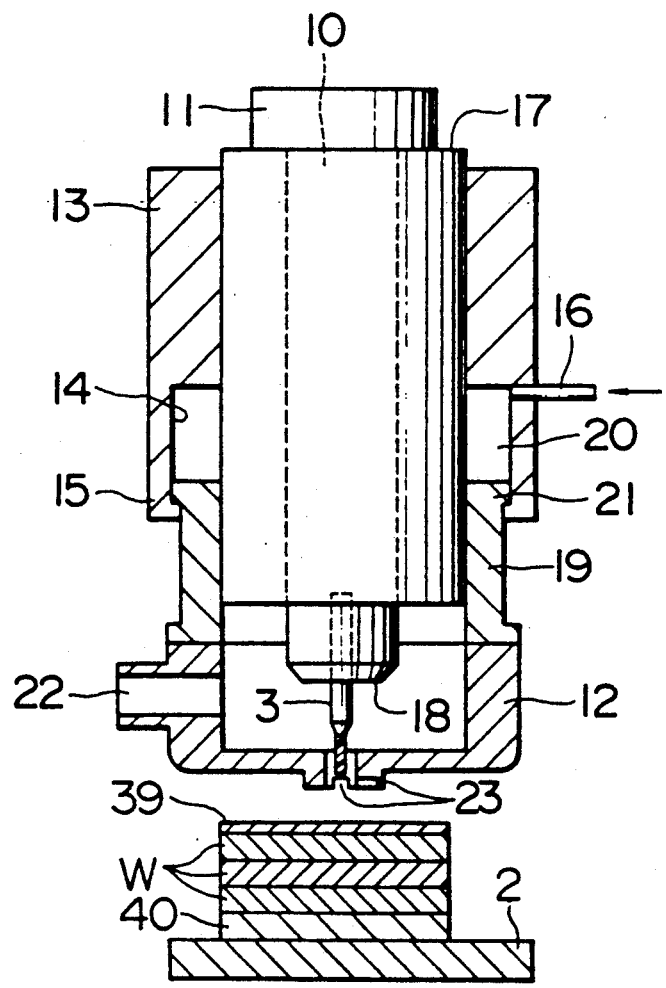
FIG. 10 is a side cross-sectional view showing a conventional spindle portion.
Figure 11:
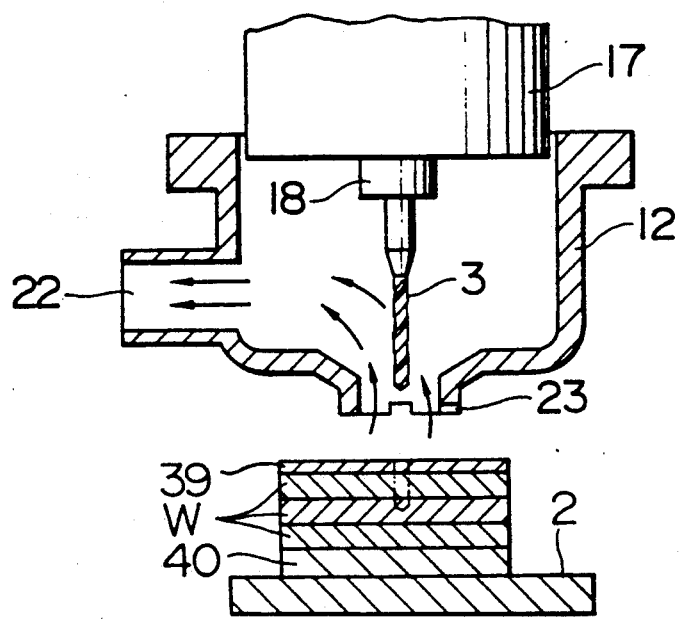
FIGS. 11 and 12 are illustrations showing a conventional pressure foot.
Figure 12:
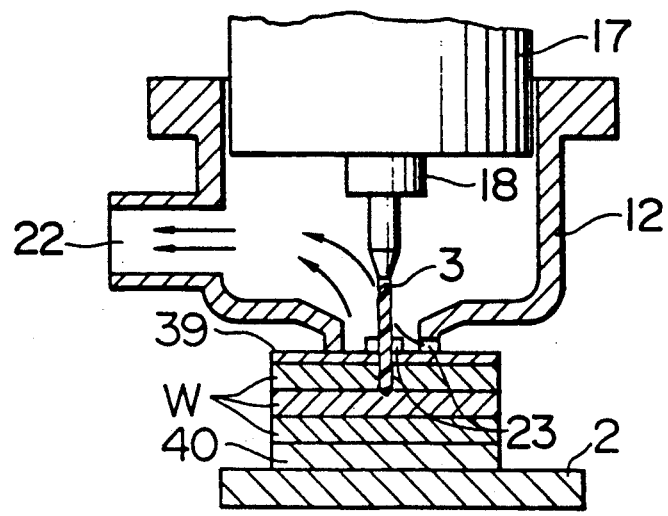

Furthermore, in accordance with the embodiment, since the amount of air supplied to the drill 3 is larger than that of the conventional machine to enhance the cooling effect of the drill 3, in the case where 9,000 drillings are effected to the printed circuit boards having a thickness 1.6 mm as shown in FIG. 8, the wear of the cutting blade may be improved by about 27%. Also, above the air flow rate of 40 l/mm, the adhesion of the chips to the drill grooves is small even in case of the drill having an aspect of 10 to 15.

What is claimed is:

1. A pressure foot for a machine for drilling a printed circuit board, said pressure foot being supported to be slidable in an axial direction of a rotor shaft, connected to a vacuum suction source and adapted to depress the printed circuit board during a drilling comprising
a first air pathway formed from a first supply port in a side wall of said pressure foot; a plurality of first blow-out ports formed in a contact surface of said pressure foot with the printed circuit board and communicating with the first air pathway, the first supply port being connected with a pressure air source; a second air pathway extending from a second supply port formed in the side wall; a plurality of second blow-out ports opened toward an interior of said pressure foot and communicating with the second air pathway, said second air pathway being in communication with a supply source of pressurized air.

2. The pressure foot according to claim 1, wherein said first air pathway communicating with the first blow-out ports formed in the contact surface of said pressure foot with the printed circuit board and the second air pathway communicating with the plurality of second blow-out ports opened toward the interior of said pressure foot are formed in a pad fixed to a lower surface of said pressure foot.

3. The pressure foot according to claim 1, wherein said second blow-out ports are tangential with an outer circumference of a drill held by the rotor shaft.

4. The pressure foot according to claim 2, wherein said second blow-out ports are tangential with an outer circumference of a drill held by the rotor shaft.

5. The pressure foot according to claim 1, wherein a nozzle having an orifice is formed in the second air pathway.

6. The pressure foot according to claim 2, wherein a nozzle having an orifice is formed in the second air pathway.

7. The pressure foot according to claim 3, wherein a nozzle having an orifice is formed in the second air pathway.

8. The pressure foot according to claim 4, wherein a nozzle having an orifice is formed in the second air pathway.

9. A printed circuit board drilling method, comprising the steps of sliding a pressure foot connected to a vacuum suction source in an axial direction of a spindle of a drilling machine toward at least one printed circuit board to be drilled;
supplying pressurized air through a first air pathway to a plurality of first blow-out ports formed in a contact surface of the pressure foot with the printed circuit board to form a thin film between the pressure foot and the printed circuit board sufficient to depress the printed circuit board for fixing the same; and
supplying the pressurized air through a second air pathway to a plurality of second blow-out ports toward an interior of the pressure foot in such manner as to cool a drill held by a rotor shaft of the drilling machine and remove clips from grooves of the drill.

10. The method in accordance with claim 9, wherein the pressurized air through the second blow-out ports is directed tangentially to an outer circumference of the drill.

11. The method in accordance with claim 9, wherein the pressurized air is expanded adiabatically through a nozzle to the second blow-out ports.

12. The method in accordance with claim 9, wherein a portion of the pressurized air through the first blow-out ports is supplied to the interior of the pressure foot to further enhance chip removal and drill cooling.

13. The method in accordance with claim 10, wherein the pressurized air is expanded adiabatically through a nozzle to the second blow-out ports.

14. The method in accordance with claim 13, wherein a portion of the pressurized air through the first blow-out ports is supplied to the interior of the pressure foot to further enhance chip removal and drill cooling.

15. The method in accordance with claim 11, wherein a portion of the pressurized air through the first blow-out ports is supplied to the interior of the pressure foot to further enhance chip removal and drill cooling.

* * * * *